(12) United States Patent
Takechi et al.

(10) Patent No.: US 7,989,805 B2
(45) Date of Patent: Aug. 2, 2011

(54) ELECTRONIC DEVICE IMPROVED IN HEAT RADIATION PERFORMANCE FOR HEAT GENERATED FROM ACTIVE ELEMENT

(75) Inventors: Kazushige Takechi, Tokyo (JP); Hiroshi Kanou, Tokyo (JP); Mitsuru Nakata, Tokyo (JP)

(73) Assignee: NEC Corporation, Tokyo (JP)

( * ) Notice: Subject to any disclaimer, the term of this patent is extended or adjusted under 35 U.S.C. 154(b) by 0 days.

(21) Appl. No.: 12/749,063

(22) Filed: Mar. 29, 2010

(65) Prior Publication Data

US 2010/0176398 A1     Jul. 15, 2010

Related U.S. Application Data

(62) Division of application No. 11/508,452, filed on Aug. 23, 2006, now Pat. No. 7,714,327.

(30) Foreign Application Priority Data

Aug. 23, 2005    (JP) .................................. 2005-241031

(51) Int. Cl.
*H01L 29/04*     (2006.01)
*H01L 31/20*     (2006.01)
*H01L 31/036*     (2006.01)
*H01L 31/0376*    (2006.01)

(52) U.S. Cl. .............................. 257/52; 257/72; 257/347

(58) Field of Classification Search .................... 257/72, 257/347, E27.116, E29.273
See application file for complete search history.

(56) References Cited

U.S. PATENT DOCUMENTS

| 6,654,075 B1 | 11/2003 | Takeichi et al. |
| 6,849,877 B2 | 2/2005 | Yamazaki et al. |
| 7,361,573 B2 * | 4/2008 | Takayama et al. ............ 438/455 |

FOREIGN PATENT DOCUMENTS

| JP | 05-206468 | 8/1993 |
| JP | 10-123964 | 5/1998 |
| JP | 11-177102 | 7/1999 |
| JP | 2000-137211 | 5/2000 |
| JP | 2001-298169 | 10/2001 |
| JP | 2004-219551 | 8/2004 |
| JP | 2004-327872 | 11/2004 |
| JP | 2004-349537 | 12/2004 |

OTHER PUBLICATIONS

Satoshi Inoue, et al, "Study of Degradation Phenomenon Due to a Combination of Contamination and Self-Heating in Poly-Si Thin Film Transistors Fabricated by a Low-Temperature Process", Jpn. J. Appl. Phys., vol. 42, (2003), pp. 4213-4217.

* cited by examiner

*Primary Examiner* — Cuong Q Nguyen
(74) *Attorney, Agent, or Firm* — Scully, Scott, Murphy & Presser, P.C.

(57) ABSTRACT

An electronic device of the present invention includes a first substrate provided with a thin film active element, having a thickness of 200 μm or lower, and a second substrate formed with a high thermal conductivity portion. The second substrate is applied to one surface of the two surfaces of the first substrate, i.e., the surface being the side other than the side that formed with the thin film active element. The thin film active element has a maximum power consumption of 0.01 to 1 mW. The high thermal conductivity portion is a region that corresponds to the position of the thin film active element and whose thermal conductivity falls within the range from 0.1 to 4 W/cm·deg.

13 Claims, 8 Drawing Sheets

ELECTRONIC DEVICE IMPROVED IN HEAT RADIATION PERFORMANCE FOR HEAT GENERATED FROM ACTIVE ELEMENT

CROSS REFERENCE TO RELATED APPLICATIONS

This application is a divisional of U.S. Ser. No. 11/508,452, filed Aug. 23, 2006, which is based upon and claims the benefit of priority from Japanese Patent Application No. 2005-241031 filed on Aug. 23, 2005, the content of which is incorporated by reference.

BACKGROUND OF THE INVENTION

1. Field of the Invention

The present invention relates to an electronic device having thin film active elements such as thin film transistors, thin film diodes etc.

2. Description of the Related Art

With the recent trend of electronic devices toward light weight, thinner and flexible configurations, technologies of transferring a thin film transistor circuit etc. formed on glass to a resin substrate have been under development. This is done because it is markedly difficult to create a high-performance thin film transistor circuit directly on a resin substrate. Further, in general, the thermal conductivity of glass substrates and resin substrates is very low, so that, concerning the thin film transistor devices formed on these substrates, the problem has come to light in which the characteristics of the device become degraded by the temperature rise of the device which becomes during operation. Some reports on this problem have been found in academic journals (Satoshi Inoue, Satoshi Takenaka and Tatsuya Shimoda, "Study of degradation phenomenon due to a combination of contamination and self-heating in poly-Si thin film transistors fabricated by a low-temperature process", Japanese Journal of Applied Physics Vol. 42 (2003) pp. 4213-4217.

As to the technologies to address this problem, for example Japanese Patent Application Laid-open 2004-219551 (to be referred to hereinbelow as patent document 1) has proposed a flexible electronic device which is formed by thinning a glass substrate formed with a thin film transistor circuit to be greater than 0 μm to 200 μm in thickness, then by applying a transparent resin film or metal film over its entire surface. In particular, the reason for applying a metal film is to efficiently radiate heat from the self-heating of the device such as thin film transistors etc., to thereby prevent degradation of the device characteristics due to increased temperatures.

Japanese Patent Application Laid-open H11-177102 (to be referred to hereinbelow as patent document 2) has proposed as a structure a thin film transistor device on a glass substrate, in which the size of a silicon active layer is made large so that it functions as a heat sinker to thereby discharge heat in an efficient manner.

Alternatively, Japanese Patent Application Laid-open 2000-137211 (to be referred to hereinbelow as patent document 3) has also disclosed as a technique a thin film transistor liquid crystal display device on a glass substrate, in which large-sized metal heat-radiating pattern elements are connected to the thin film transistor circuits disposed around the substrate so as to enhance the effect of heat radiation.

Further, Japanese Patent Application Laid-open 2001-298169 (to be referred to hereinbelow as patent document 4) discloses a technique for an improved heat radiation effect by forming a thin film transistor device on a sapphire substrate having a higher thermal conductivity than glass.

In the aforementioned prior art, patent document 2 and patent document 3 achieve efficient heat radiation by manipulating the structure of the thin film transistor device on the glass substrate. However, these techniques entail at least two problems. The first is that the size of the thin film transistor device becomes large, hence making it difficult to achieve high integration. Secondly, since the heat sink pattern elements have to be formed outside the thin film transistor array region, extra areas and processes are required.

On the other hand, in patent document 4, heat radiation characteristics of thin film transistors are improved by thinning the sapphire substrate having a relatively high thermal conductivity. However, this method entails the problem that the sapphire substrate is very expensive. Further, though it has a higher thermal conductivity than glass and resin substrates, the heat radiation performance is not sufficient, so that it, after all, this method cannot avoid the temperature rise problem as integration of thin film transistors becomes higher in the future.

Moreover, in patent document 1, heat radiation performance is improved by thinning the glass with thin film transistors formed thereon by etching and applying a high thermal conductivity film of metal etc., on the underside of the glass. However, since the high thermal conductivity film is applied over the entire undersurface, its usage is limited to narrow applications. In particular, it cannot be applied to liquid crystal displays etc., which make use of light transmission.

SUMMARY OF THE INVENTION

The object of the present invention is to provide an electronic device having improved heat radiation performance for heat generated from thin film active elements.

According to the present invention, an electronic device comprises a first substrate having a thickness of 200 μm or lower with a thin film active element having a maximum power consumption of 0.01 to 1 mW formed thereon, and a second substrate being applied to one surface of the two surfaces of said first substrate, the surface being the side other than that formed with said thin film active element, wherein a high thermal conductivity portion as a region whose thermal conductivity falls within the range from 0.1 to 4 W/cm·deg is provided in correspondence to the position of said thin film active element.

In the present invention, a first substrate formed with a thin film active element having a maximum power consumption of 0.01 to 1 mW is applied to a second substrate, in which a region whose thermal conductivity falls within the range from 0.1 to 4 W/cm·deg is provided in correspondence to the position of the thin film active element. Accordingly, heat generated from the device can be radiated through a high thermal conductivity portion of the second substrate.

As a result, it is possible to provide an electronic device whose heat radiation performance is more effective as regards radiating heat from a thin film active element having high power consumption than in conventional configurations. Further, concerning the substrate for heat radiation, it is possible to use a transparent material for regions except for those regions having elements which generate a greater amount of heat. For this reason, the device can be applied to a liquid crystal display which makes use of light transmission.

The above and other objects, features and advantages of the present invention will become apparent from the following description with reference to the accompanying drawings which illustrate examples of the present invention.

DETAILED DESCRIPTION OF THE PREFERRED EMBODIMENT

An electronic device of the present invention is characterized by inclusion of a substrate having a region excellent in heat radiation performance formed in correspondence to the locations that have thin film active elements with high power consumption.

The First Embodiment

Figure 1A:
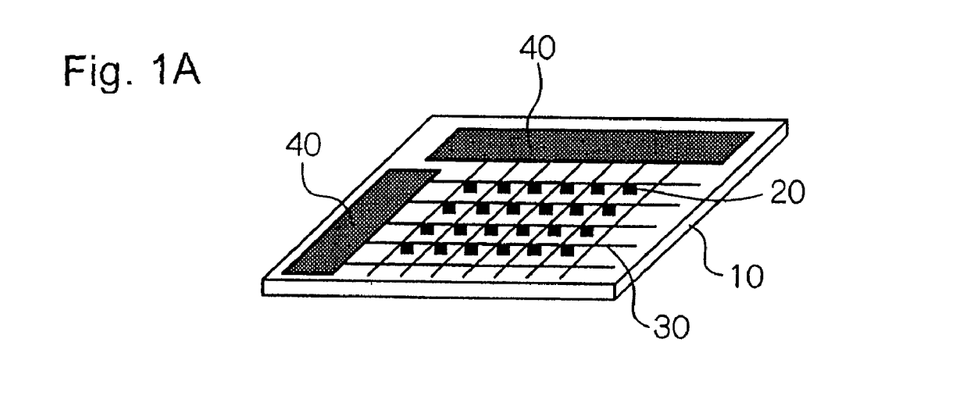
FIGS. 1A, 1B and 1C are perspective views showing a structure of an electronic device in the first embodiment of the present invention.
Figure 1B:
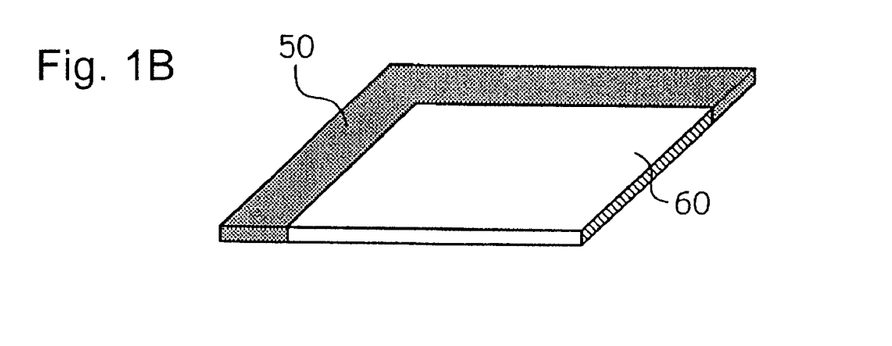
Figure 1C:
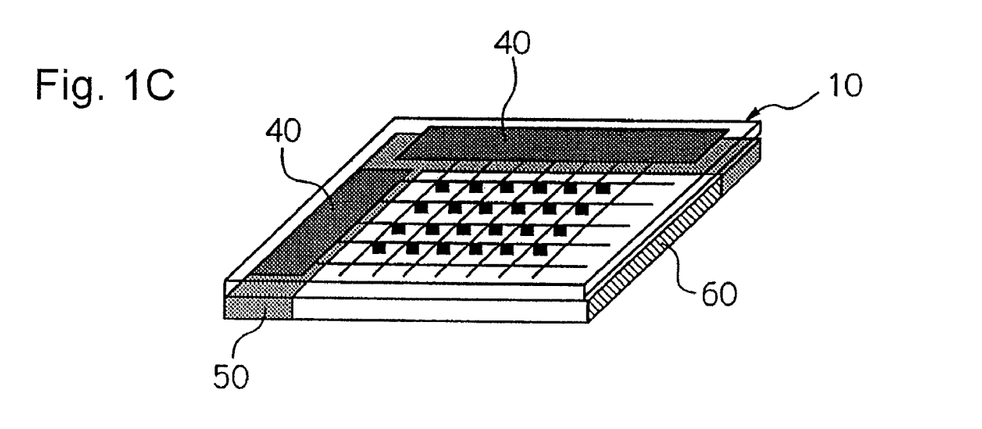

The configuration of an electronic device of the present embodiment will be described with reference to the drawings. FIGS. 1A to 1C are perspective views showing a structure of an electronic device of the present embodiment. FIG. 1A shows an array substrate on which a plurality of thin film transistors are formed; FIG. 1B shows a support substrate; and FIG. 1C shows an electronic device of the present embodiment.

As shown in FIG. 1A, formed on insulative substrate 10 having a thickness greater than 0 μm to 200 μm or lower, in the array substrate, are thin film transistors 20 arranged matrix-wise with matrix interconnections 30 and peripheral drive circuit portions 40 for driving thin film transistors 20 arranged matrix-wise. Peripheral drive circuit portion 40 is formed with a thin film transistor array (not shown) having a plurality of thin film transistors aligned thereon.

As an example of an array substrate having this circuit configuration, active matrix-drive displays, image sensors, etc. can be mentioned. In this case, thin film transistors 20 operate as switching elements for individual pixels. Peripheral drive circuit portion 40 includes a shift register, a digital-analog conversion circuit (DAC circuit) and a power supply circuit. Here, the region of peripheral drive circuit portion 40 includes thin film transistor elements having a maximum instantaneous power consumption of 0.05 mW or greater.

In the connection with the above, it has been found that when a thin film transistor with a power consumption of 0.05 mW is continuously operated for some tens of minutes, the characteristics of the thin film transistor deteriorate. On the basis of this fact, if a thin film transistor with a power consumption of 0.01 mW is operated in the order of some hundreds hours, the occurrence of degradation in performance can be easily predicted. In during the process of product design in which transistors have the maximum power consumption, amongst all the thin film transistors, are provided on the array substrate, the maximum power consumption will be as high as 1 mW.

Thin film transistors 20 arranged matrix-wise are also laid out in an array-wise arrangement, but the maximum value of the power consumption as a single item is too low to consider, compared to that of peripheral drive circuit portion 40.

The support substrate shown in FIG. 1B is composed of high thermal conductivity portion 50 whose material is a thermal conductivity greater than 0.1 W/cm·deg and support base 60 as a part having an arbitrary thermal conductivity. When thermal conductivity was specified to be 0.01 W/cm·deg (normal glass substrate), experimental data indicating degradation in device characteristics was obtained. On the other hand, when thermal conductivity was specified to be 1.0 to 4.0 W/cm·deg (e.g., metal film substrate), degradation of the device characteristics was too small to matter.

From these facts, it can be predicted that the thermal conductivity of high thermal conductivity portion 50 needs to be set within the range from 0.1 to 4 W/cm·deg. Further, to achieve more efficient heat radiation, the thermal conductivity of high thermal conductivity portion 50 preferably falls within the range of 0.5 to 4 W/cm·deg.

As shown in FIG. 1C, the electronic device of the present embodiment has an array substrate shown in FIG. 1A and a support substrate shown in FIG. 1B, and is configured so that these two substrates are applied one over the other. The region of the support substrate of FIG. 1B located under the regions formed with peripheral drive circuit portions 40 is high thermal conductivity portion 50 consisting of a material whose thermal conductivity falls within the range of 0.1 to 4 W/cm·deg.

With this arrangement, Joule heat generated in peripheral drive circuit portion 40 in the region where high power consumption thin film transistors are integrated can be efficiently released from high thermal conductivity portion 50 through thin insulative substrate 10. As a result it is possible to suppress reliability degradation of device characteristics caused by self-heating.

EXAMPLE 1

As an example of the first embodiment, an active matrix substrate for liquid crystal display will be explained.

In this example, a glass substrate having a thickness of 30 μm is used as insulative substrate 10. A silicon thin film transistor is used as thin film transistor 20. An aluminum interconnection is used as matrix interconnection 30. Peripheral drive circuit portion 40 includes a shift register made up of a silicon thin film transistor array, a digital-analog conversion circuit (DAC circuit), a power supply circuit, a buffer, an analog switching circuit and the like. As in this example, insulative substrate 10 formed with silicon thin film transistors thereon is called a thin type glass thin film transistor substrate.

As the support substrate, a copper film having a thermal conductivity of 4 W/cm·deg is used for high thermal conductivity portion 50, and a transparent film having a transmittance of 70% or greater for visible light rays with wavelengths of 380 nm (violet) to 770 nm (red) is used as support base 60.

Next, the manufacturing method of the electronic device of the example will be briefly described.

Using a transfer method as disclosed in patent document 1, silicon thin film transistors, aluminum interconnections and peripheral drive circuit portions 40 are formed on a glass substrate having a thickness of 30 μm to produce a thin type glass thin film transistor substrate. Copper film and transparent film are cut beforehand in predetermined shapes and joined to each other using an adhesive or the like to prepare a support substrate shown in FIG. 1B. Then these two substrates are bonded one over the other by an adhesive or the like to thereby complete an active matrix substrate for a liquid crystal display having excellent heat radiation performance.

Next, the operation result of the electronic device of this example will be explained.

When the active matrix substrate of this example was driven with a power supply voltage of 5V, the power consumption of a thin film transistor, having a wide channel whose width was 20 μm in the analog switching circuit portion, was about 0.1 mW. As the temperature of the circuit portion was measured using an infrared radiation thermometer, the temperature rise caused by Joule heat was suppressed at around 70 deg. C., and no degradation of the device characteristics was observed after a long period of operation. On the other hand, when, for comparison, the same measurement was made with a standard, active matrix substrate formed on glass with a thickness of 0.5 mm, the temperature of the aforementioned circuit portion was elevated up to about 200 deg. C., and gradual degradation of the device characteristics was observed. From this result, it is understood that use of the present invention makes it possible to realize a highly reliable active matrix substrate that has excellent heat radiation performance.

In the electronic device of the present embodiment, the array substrate formed with thin film active elements having a maximum power consumption of 0.01 to 1 mW is applied to the support substrate, and the support substrate is formed with a region whose thermal conductivity falls within a range from 0.1 to 4 W/cm·deg, corresponding to the thin film active elements. Accordingly, heat generated from the device can be sufficiently radiated through the high thermal conductivity portion of the support substrate.

As described in example 1, transparent film is used for the regions except for those regions having copper film. Instead of transparent film, an optical functional film such as a polarization film, phase difference film or the like may also be used. In the support substrate, material having a high thermal conductivity may be disposed only under the region where thin film transistors that have high power consumption, hence high are self-heating, are formed, while various kinds of functional materials such as transparent materials, optical materials having birefringence and polarization, may be arranged in the other regions. Accordingly, this embodiment can be applied to various kinds of electronic devices.

As the method of allocating materials having different properties to different areas, a plurality of desired different materials (including high thermal conductive material) are combined beforehand to form a single substrate, then the substrate is applied to the array substrate formed with thin film transistors. Thus, joining high-thermal conductive material and functional materials makes it possible to produce desired electronic devices at low costs.

Further, since heat radiation performance close to that of silicon wafer devices can be realized, devices which could be realized only with silicon wafers can be realized by the electronic device of the present embodiment. In this case, when glass substrate thin film transistors are used, the glass substrate can be made large in size, so that a greater number of devices can be produced from one substrate, compared to that from the silicon wafer, hence it is possible to produce electronic devices having equivalent performance at low costs.

Here, as an adhesive for applying the support substrate including transparent film and copper film to glass, silicone resin material, which presents a relatively high thermal conductivity may be used for further improved heat radiation performance.

When the glass thickness is up to 200 μm, temperature rise can be suppressed to 150 deg. C or lower, so that it is possible to confirm the effect of maintaining reliability of the device characteristics. However, if the glass thickness exceeds 200 μm, heat builds up inside the glass so that the device is elevated in temperature up to about 200 deg. C., thus failing to obtain any radiation effect.

The thickness of the film consisting of high thermal conductivity material needs to be 5 μm or greater. This is because, when the thickness is less than 5 μm, the device temperature rises to about 200 deg. C., causing degradation of the device characteristics. In effect, if the film has a thickness of 100 μm, a sufficient enough heat radiation effect can be obtained.

Also, the support substrate does not necessarily have to be formed of copper film or transparent film, but, for example a base formed of a metal plate having a thickness of about 0.5 mm and a glass plate or resin substrate having a thickness of about 0.5 mm may be applied to the thin-type glass thin film transistor substrate. Though copper film was used for high thermal conductivity portion 50, a material that contains, as an insulative material, a filler for enhanced thermal conductivity namely, high thermal conductive filler, may be used.

Further, though this embodiment was described taking an example of a liquid crystal display, display devices using a self-luminous element such as an EL (electro luminescence) element etc., are also possible. In particular, if a self-luminous element is used, support base 60 does not necessarily have to be transparent.

The Second Embodiment

Figure 2A:
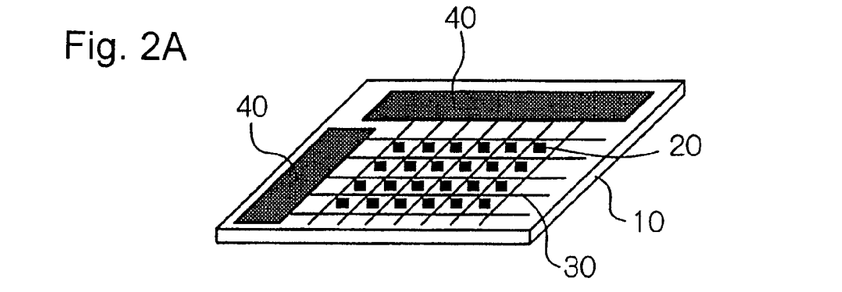
FIGS. 2A, 2B and 2C are perspective views showing a structure of an electronic device in the second embodiment of the present invention.
Figure 2B:
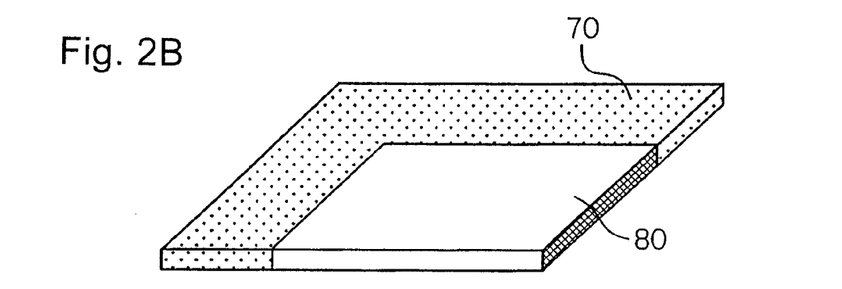
Figure 2C:
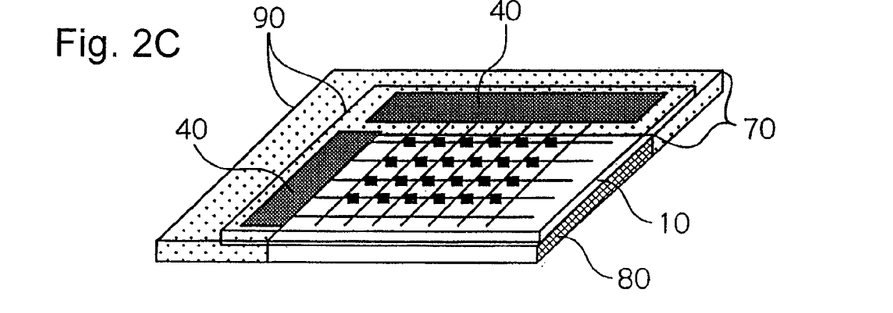

The configuration of an electronic device of the present embodiment will be described. FIGS. 2A to 2C are perspective views showing an electronic device structure of the present embodiment.

An array substrate shown in FIG. 2A has a configuration similar to that of the array substrate shown in FIG. 1A, which was described in the first embodiment.

A support substrate shown in FIG. 2B is composed of high thermal conductivity thin-film portion 70 that is covered with a thin film of a material whose thermal conductivity falls within the range of 0.1 to 4 W/cm·deg and support base 80 that is not covered therewith. This support substrate is larger in size than the array substrate of FIG. 2A.

As shown in FIG. 2C, the electronic device of the present embodiment has an array substrate shown in FIG. 2A and a support substrate shown in FIG. 2B, and is configured so that these two substrates are applied one over the other. The surface of the region of the support substrate of FIG. 2B located under the region formed with peripheral drive circuit portions 40 is covered with a thin film consisting of a material whose thermal conductivity falls within the range of 0.1 to 4 W/cm·deg. Further, as regards high thermal conductivity thin-film portion 70, it includes peripheral portion 90 which will not overlap the array substrate of FIG. 2A.

With this arrangement, Joule heat generated in region 40 where high power consumption thin film transistors are integrated can be efficiently released from high thermal conductivity thin-film portion 70 through thin insulative substrate 10. In the present embodiment, differing from the case of the first embodiment, Joule heat is made to dissipate sideways so that heat will escape efficiently from the portion at peripheral portion 90.

EXAMPLE 2

As an example of the second embodiment, an active matrix substrate for a liquid crystal display will be explained.

In this example, the array substrate shown in FIG. 2A has the same configuration as that of example 1 except that a glass substrate of 100 μm thick is used as insulative substrate 10. This substrate is called a thin film transistor substrate.

An optical functional film having polarizing functionality is used as the support substrate shown in FIG. 2B. That is, support base 80 is an optical functional film. On the other hand, high thermal conductivity thin-film portion 70 is film formed by plating a nickel thin-film having a thermal conductivity of 1 W/cm·deg over the optical functional film surface. Here, the thin-film in high thermal conductivity thin-film portion 70 may also be film formed at desired positions by a spraying method such as ink jet etc.

Next, the manufacturing method of the electronic device of this example will be briefly described.

Using a transfer method as disclosed in patent document 1, silicon thin film transistors, aluminum interconnections and peripheral drive circuit portions 40 are formed on a glass substrate having a thickness of 100 nm to produce a thin film transistor substrate. Thin film transistors may be formed directly on a thin glass substrate. A nickel thin-film having a thickness of 3 μm is film formed by plating on the polarization film at the desired part to produce a support substrate shown in FIG. 2B. Then these two substrates are bonded one over the other by an adhesive or the like to thereby complete an active matrix substrate for liquid crystal display having excellent heat radiation performance. In this case, in order to efficiently release heat generated from the thin film transistors, peripheral portion 90 is preferably extended outwards 1 mm or greater beyond the edge of the thin film transistor substrate.

Next, the experimental result of the operation of the electronic device of this example will be explained.

When the active matrix substrate of this example was driven with a power supply voltage of 5V, the power consumption of a thin film transistor, having a wide channel whose width was 20 μm in the analog switching circuit portion, was about 0.1 mW. When the temperature of the circuit portion was measured using an infrared radiation thermometer, the temperature rise caused by Joule heat was suppressed at around 90 deg. C., and no degradation of the device characteristics was observed after a long period of operation. From this experiment result, it is understood that use of this configuration makes it possible to realize a highly reliable active matrix substrate having excellent heat radiation performance, as in example 1.

Also in the electronic device of the present embodiment, the array substrate formed with thin film active elements having a maximum power consumption of 0.01 to 1 mW is applied to the support substrate, and the support substrate is covered with a thin-film whose thermal conductivity falls within a range from 0.1 to 4 W/cm·deg, over the area corresponding to the thin film active elements. Accordingly, heat generated from the device can be sufficiently radiated through the high thermal conductivity thin-film, so that the same effect as in the first embodiment can be obtained. Similar to the first embodiment, various functional materials can be arranged in the support substrate in portions other than the area where high thermal conductivity thin-film is formed.

As the method of allocating materials having different properties to different areas, a high thermal conductivity material film is previously formed on a desired region on a substrate of a certain material, then the substrate is applied to the array substrate formed with thin film transistors. Thus, joining of the high thermal conductivity material and functional materials makes it possible to produce desired electronic devices at low cost.

Here, as an adhesive for applying the support substrate including nickel film and optical functional film to glass, silicone resin material, which has relatively high thermal conductivity, may be used for further improved heat radiation performance.

Instead of polarization film, transparent film or phase difference film may be used. In the case of transparent film, the film may have a transmittance of 70% or greater for visible light rays as in example 1. Further, when the glass thickness is up to 200 μm, the temperature rise can be suppressed to 150 deg. C. or lower, so that it is possible to confirm the effect of maintaining reliability of the device characteristics. If the glass thickness exceeds 200 μm, heat builds up inside the glass so that the device is elevated in temperature up to about 200 deg. C., thus failing to obtain any radiation effect.

The film thickness of high thermal conductivity thin-film portion 70 needs to be 0.1 μm or greater. With a thickness of less than 0.1 μm, the device temperature rises up to about 200 deg. C., causing degradation of the device characteristics. The thicker the thin-film, the greater radiation effect it can provide. However, because it takes a longer time to form film, this lowers the throughput and the result is that maximum thickness may be about 100 μm. If the film forming rate can be enhanced, the film thickness may be made greater.

Peripheral portion 90 is preferably extended outwards with a sticking out distance of 1 mm or greater beyond the edge of the thin film transistor substrate. If the distance is smaller than 1 mm, the device will be elevated in temperature up to 200 deg. or higher in some cases depending on the power consumption of the thin film transistors. It is considered that a sufficient radiation effect can be obtained if the sticking out distance is as much as 5 mm. Here, the sticking out distance beyond the edge of the substrate is defined as the distance of the line that is perpendicular to the side of the substrate and parallel to the substrate plane, from the edge of the substrate.

It is not always necessary to use nickel thin-film and polarization film, but the base of a glass plate or resin substrate having a thickness of about 0.5 mm, for example, with a metal thin-film formed at desired positions, may be applied to the thin-type glass thin film transistor substrate. Though nickel thin-film was used for high thermal conductivity thin-film portion 70, the thin-film may be formed with a material that contains, as an insulative material, a filler for enhanced thermal conductivity, namely, high thermal conductive filler.

Further, though this embodiment was described taking an example of a liquid crystal display, display devices using a self-luminous element such as an EL (electro luminescence) element etc., may also be used. In particular, if a self-luminous element is used, support base 80 does not necessarily have to be transparent.

The Third Embodiment

The configuration of an electronic device of the present embodiment will be described. Here, the same components as in the second embodiment are allotted with the same reference numerals with detailed description omitted.

Figure 3A:
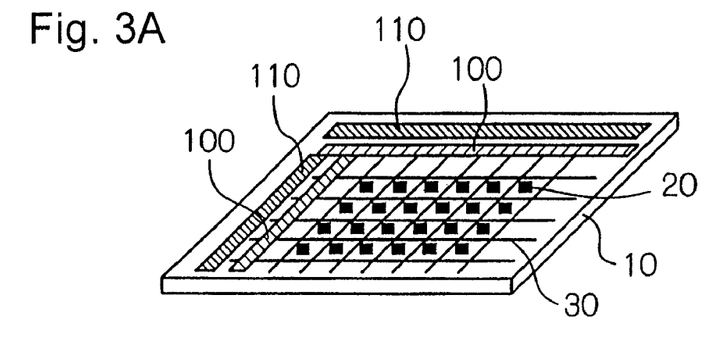
FIGS. 3A, 3B and 3C are perspective views showing a structure of an electronic device in the third embodiment of the present invention.
Figure 3B:
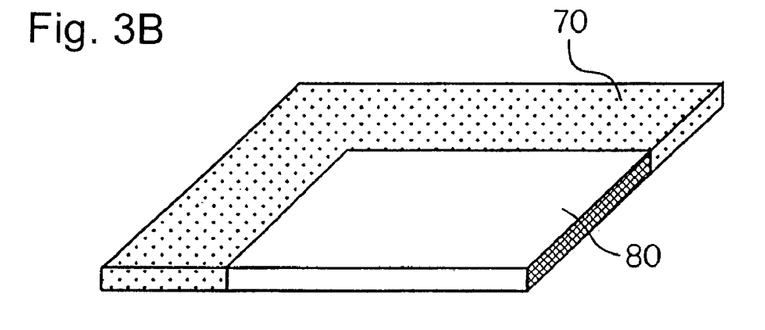
Figure 3C:
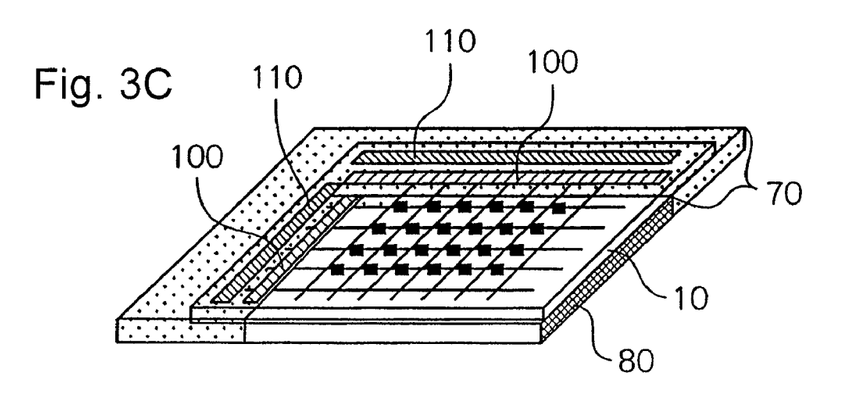

FIGS. 3A to 3C are perspective views showing a structure of an electronic device of this embodiment. FIG. 3A shows an array substrate on which a plurality of thin film transistors are formed, and FIG. 3B shows a support substrate. FIG. 3C shows an electronic device of this embodiment, and the electronic device of this embodiment is composed of an array substrate shown in FIG. 3A and a support substrate shown in FIG. 3B applied one over the other.

The difference from the second embodiment is the fact that the peripheral drive circuit portions on the array substrate shown in FIG. 3A include high-power consumption portion 110 in which thin film transistors having a higher maximum power consumption than those in peripheral drive circuit portion 40 shown in FIG. 2A are included, and low-power consumption portion 100 in which thin film transistors having a lower maximum power consumption than those in peripheral drive circuit portion 40 are included. The thin film transistor, included in peripheral drive circuit portion 40, which is the standard for maximum power consumption, is referred to as a standard thin film transistor.

As shown in FIG. 3A, high power consumption portion 110 is arranged in a region closer to the edge of the array substrate than low power consumption portion 100. High power consumption portion 110 may be composed of a single thin film transistor in some cases and may be formed with multiple arrays having a plurality of thin film transistors in other cases. In particular, buffers, analog switching circuits and the like include thin film transistors having large channel widths and high power consumption, so that formation of these circuit components in the region closer to the substrate edge is effective for heat radiation.

Though, in the above description, high power consumption portion 110 was defined to be a region in which thin film transistors having a higher maximum power consumption than those in low power consumption portion 100 are included, it is also possible to define high power consumption portion 110 as a region whose power consumption per unit area is greater than that of low power consumption portion 100. Alternatively, it is also possible to define high power consumption portion 110 to be a region that has a higher power consumption per unit area than that of the low power consumption portion 100 if compared with the fixed area size. In any case, provision of high power consumption portion 110 at a position closer to the substrate edge makes it possible to achieve heat radiation more efficiently. In this embodiment, the support substrate of the second embodiment was used, but the support substrate of the first embodiment may also be used instead.

The Fourth Embodiment

The configuration of an electronic device of the present embodiment will be described. The first to third embodiments were described taking examples where the present invention is applied to a display active matrix substrate on which thin film transistors having a maximum power consumption equal to or greater than a predetermined level are arranged around the substrate. In the electronic device of this embodiment, thin film transistors having high power consumption are provided not only in the periphery of the substrate but also in arbitrary areas other the periphery.

Figure 4A:
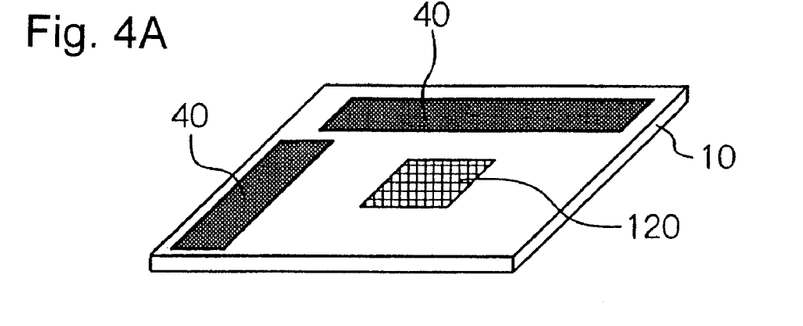
FIGS. 4A, 4B and 4C are perspective views showing a structure of an electronic device in the fourth embodiment of the present invention.
Figure 4B:
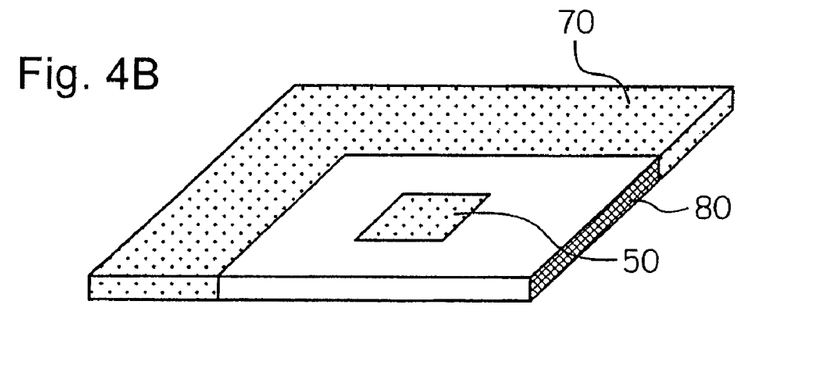
Figure 4C:
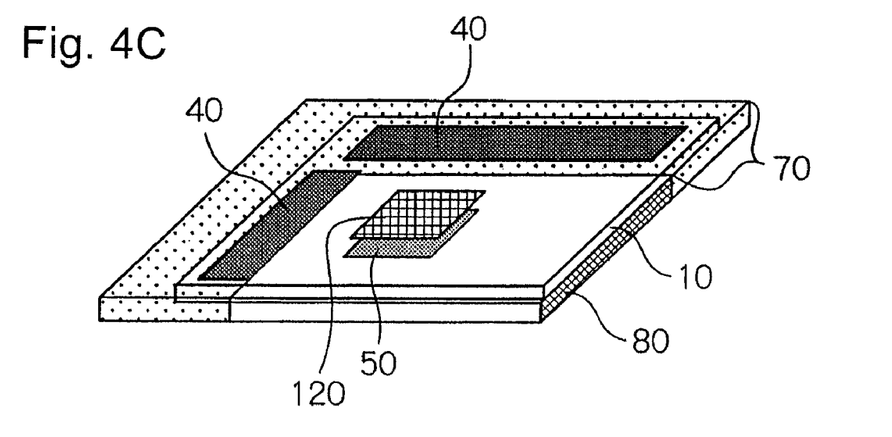

FIGS. 4A to 4C are perspective views showing a structure of an electronic device of this embodiment. FIG. 4A shows an array substrate on which a plurality of thin film transistors are formed, and FIG. 4B shows a support substrate. FIG. 4C shows an electronic device of this embodiment, and the electronic device of this embodiment is composed of an array substrate shown in FIG. 4A and a support substrate shown in FIG. 4B applied one over the other. Here, the same components as those in the first embodiment and the second embodiment are allotted with the same reference numerals with detailed description omitted.

As shown in FIG. 4A, thin film transistor array 120 having a higher power consumption equal to or higher than a predetermined level is provided in periphery and in an arbitrary area that is not part of the periphery. In FIG. 4A, a single thin film transistor array 120 is provided but more than one array may be formed.

As shown in FIG. 4B, the support substrate is formed with high thermal conductivity portion 50 consisting of a material whose thermal conductivity falls within the range of 0.1 to 4 W/cm·deg, in the position corresponding to the area where thin film transistor array 120 is formed. The surface of support base 80 located under the region formed with peripheral drive circuit portions 40 is covered with high thermal conductivity thin-film 70, a film material whose thermal conductivity falls within the range of 0.1 to 4 W/cm·deg.

Then, in the electronic device of this embodiment, the array substrate shown in FIG. 4A and the support substrate shown in FIG. 4B are applied one over the other as shown in FIG. 4C, so that high thermal conductivity portion 50 is located under the region where thin film transistor array 120 is formed. Further, high thermal conductivity thin-film 70 is disposed under the region where peripheral drive circuit portions 40 are formed. In this way, the electronic device of the present embodiment combines configuration of the high thermal conductivity portion of the first embodiment with the high thermal conductivity thin-film portion of the second embodiment.

In the electronic device of this embodiment, heat arising from peripheral drive circuit portions 40 is released through high thermal conductivity thin-film portion 70 and heat arising from thin film transistor array 120 is released through high thermal conductivity portion 50. Thus, temperature rise can be inhibited.

The Fifth Embodiment

Figure 5A:
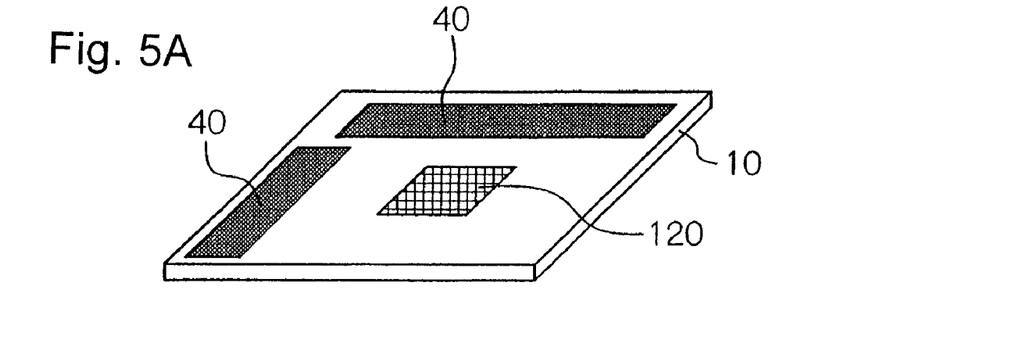
FIGS. 5A, 5B and 5C are perspective views showing a structure of an electronic device in the fifth embodiment of the present invention.
Figure 5B:
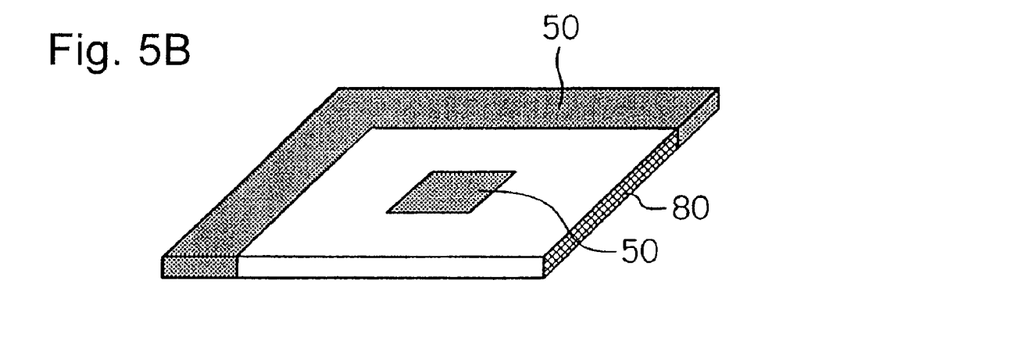
Figure 5C:
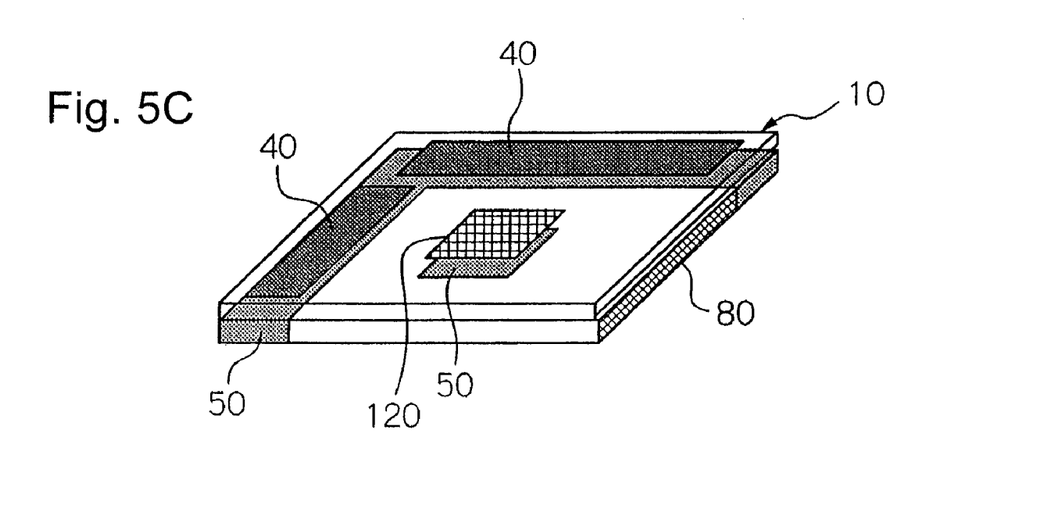

The configuration of an electronic device of the present embodiment will be described. FIGS. 5A to 5C are perspective views showing a structure of an electronic device of this embodiment.

FIG. 5A shows an array substrate on which a plurality of thin film transistors are formed, and FIG. 5B shows a support substrate. FIG. 5C shows an electronic device of this embodiment, and the electronic device of this embodiment is composed of an array substrate shown in FIG. 5A and a support substrate shown in FIG. 5B applied one over the other. Here, the same components as those in the fourth embodiment are allotted with the same reference numerals with detailed description omitted.

The electronic device of the present embodiment is configured so that the portion, where high thermal conductivity thin-film 70 in the periphery is formed in the fourth embodiment, is replaced with high thermal conductivity portion 50 consisting of a material whose thermal conductivity falls within the range of 0.1 to 4 W/cm·deg. Also in the electronic device of this embodiment, the same effect as in the fourth embodiment can be obtained.

The Sixth Embodiment

Figure 6A:
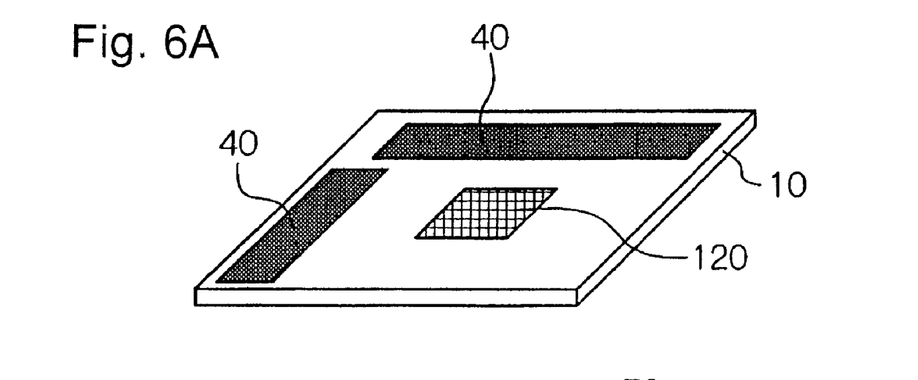
FIGS. 6A, 6B and 6C are perspective views showing a structure of an electronic device in the sixth embodiment of the present invention.
Figure 6B:
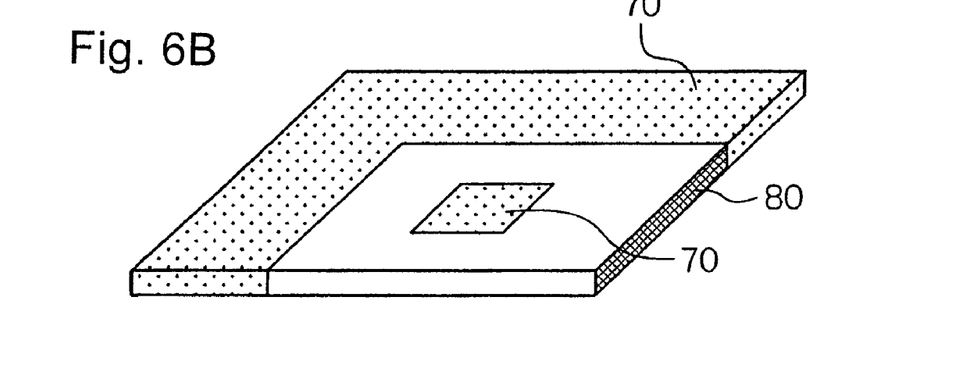
Figure 6C:
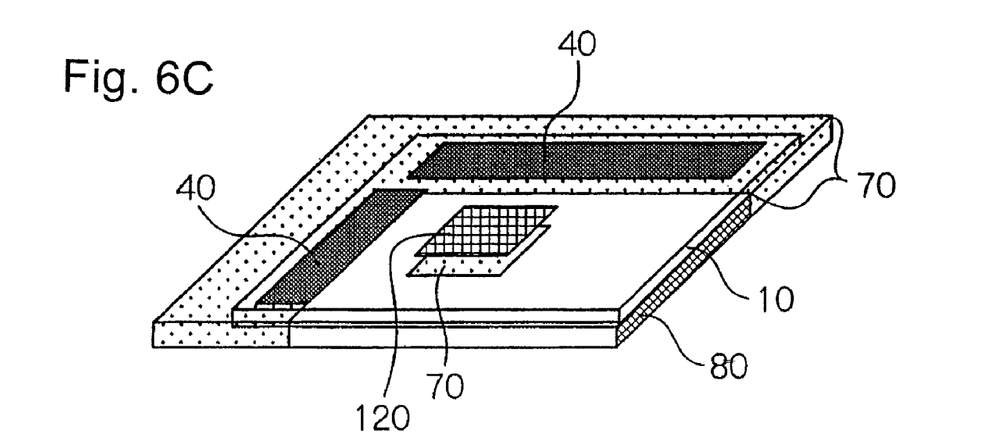

The configuration of an electronic device of the present embodiment will be described. FIGS. 6A to 6C are perspective views showing a structure of an electronic device of this embodiment.

FIG. 6A shows an array substrate on which a plurality of thin film transistors are formed, and FIG. 6B shows a support substrate. FIG. 6C shows an electronic device of this embodiment, and the electronic device of this embodiment is composed of an array substrate shown in FIG. 6A and a support substrate shown in FIG. 6B applied one over the other. Here, the same components as those in the fourth embodiment are allotted with the same reference numerals with detailed description omitted.

In the electronic device of the present embodiment, there are some areas that are covered with high thermal conductivity thin-film portion 70 made of a film material whose thermal conductivity falls within the range from 0.1 to 4 W/cm·deg, not only in the periphery of the support substrate and but also in arbitrary regions other than the periphery. In the present embodiment, as shown in FIG. 6B, the center and its vicinity of support base 80 are covered by high thermal conductivity thin-film portion 70. The position of high thermal conductivity thin-film portion 70 at around the center of the support substrate corresponds to thin film transistor array 120, as shown in FIG. 6A. In this case, heat generated from thin film transistor array 120 cannot escape sideways. Accordingly, the film thickness of high thermal conductivity thin-film portion 70 at around the center of the support substrate, shown in FIG. 6B, is preferably 0.5 μm or greater. In this way, the film thickness of high thermal conductivity thin-film portion 70 may be specified at a desirable thickness depending on individual regions.

An integrated circuit in which an arithmetic processing circuit is provided in the form of thin film transistor array 120 at the center of the array substrate, a power source circuit and a controller circuit that are formed as the thin film transistor arrays of peripheral drive circuit portions 40, for example, may be considered as a possible electronic device of the present embodiment. In the circuit portions, such as an arithmetic processing circuit, a power source circuit, a controller circuit and the like, thin film transistors that consume high power are high density integrated. Provision of high thermal conductivity thin-film portion 70 underneath such circuit portions contributes to improvement of heat radiation performance. The portions other than these circuit portions may be formed with, for example a transparent resin substrate, glass substrate or the like, as required. Therefore, support base 80 may be formed of a transparent resin substrate, glass substrate or the like.

Though all the examples shown as in the first to sixth embodiments include peripheral drive circuit portion 40, it is not always necessary to include peripheral drive circuit portion 40. The present invention exemplified in the above first to sixth embodiments can be applied to an electronic device including at least one of peripheral drive circuit portion 40 and thin film transistor array 120 located at around the center of the substrate. Also, the surface of high thermal conductivity portion 50 and high thermal conductivity thin-film portion 70 does not necessarily have to be flat, but may have a surface roughness of the order of some thousands of angstroms to some microns. Use of such an unevenness structure makes the effective contact area for heat radiation larger than that of the flat structure, hence more efficient heat radiation can be expected.

The Seventh Embodiment

Figure 7A:
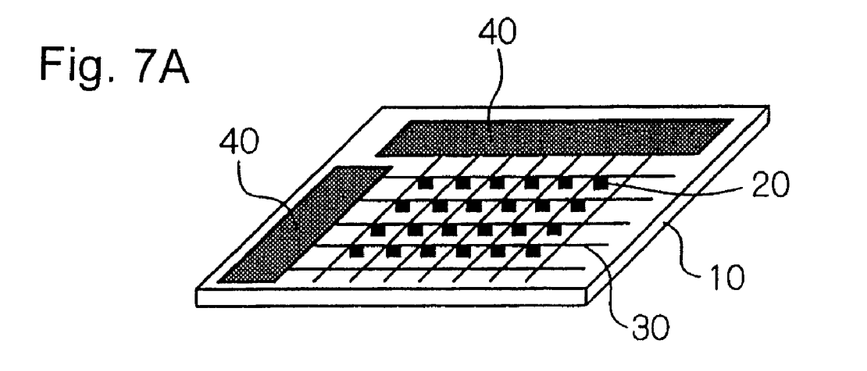
FIGS. 7A, 7B and 7C are perspective views showing a structure of an electronic device in the seventh embodiment of the present invention; and, FIG. 8 is a schematic sectional view showing a structure of an electronic device in the eighth embodiment of the present invention.
Figure 7B:
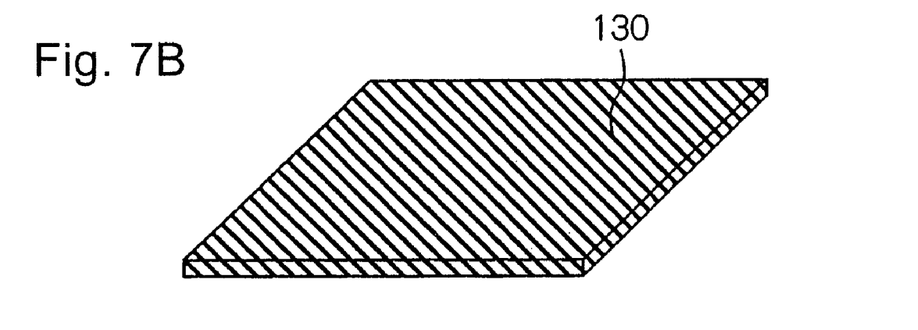
Figure 7C:
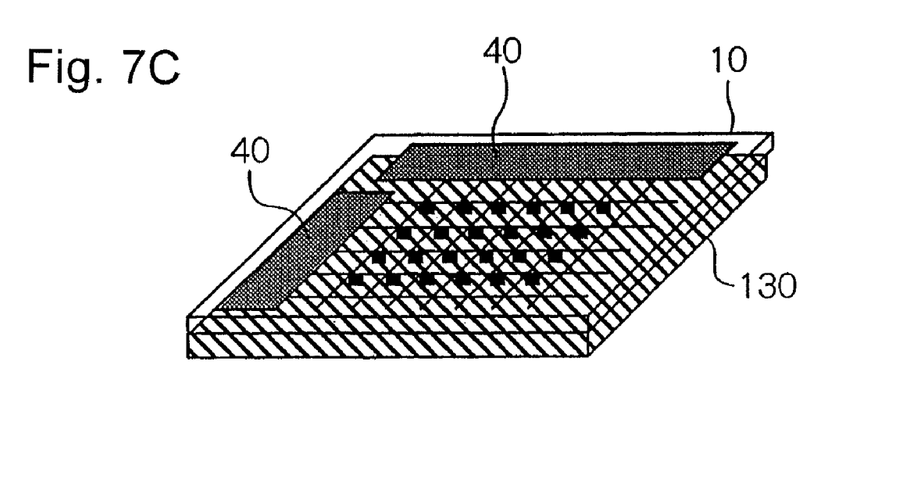

The configuration of an electronic device of the present embodiment will be described. FIGS. 7A to 7C are perspective views showing a structure of an electronic device of this embodiment.

FIG. 7A shows an array substrate on which a plurality of thin film transistors are formed, and FIG. 7B shows a support substrate. FIG. 7C shows an electronic device of this embodiment, and the electronic device of this embodiment is composed of an array substrate shown in FIG. 7A and a support substrate shown in FIG. 7B applied one over the other. Here, the same components as those in the first embodiment are allotted with the same reference numerals with detailed description omitted.

The array substrate shown in FIG. 7A has the same configuration as the array substrate shown in FIG. 1A, described in the first embodiment.

In the support substrate shown FIG. 7B, the entire surface of the substrate is formed with metal thin-film 130. Coverage of the entire surface with a metal thin-film permits the whole surface to radiate heat from the array substrate, thus enhancing heat radiation. Further, the surface that is put in contact with the array substrate of FIG. 7A is formed with an uneven texture. Further, in the configuration shown in FIG. 7C, when uneven textures are formed between the two substrates as stated above, the effective contact area that contributes to heat radiation becomes greater than the case with flat textures, hence an improved heat radiation effect can be expected. It is also possible to expect a light diffusion effect from the uneven textures. Accordingly, use of the support substrate of FIG. 7B not only for heat radiation purposes but also for light reflection and light diffusion purposes enables application of the device to a high performance reflection type active matrix substrate for liquid crystal displays.

Instead of forming a metal thin-film on the support substrate surface, it is also possible to produce the support substrate itself with a metallic material and to form an uneven texture on the support substrate surface that comes in contact with the array substrate shown in FIG. 7A.

The Eighth Embodiment

Figure 8:
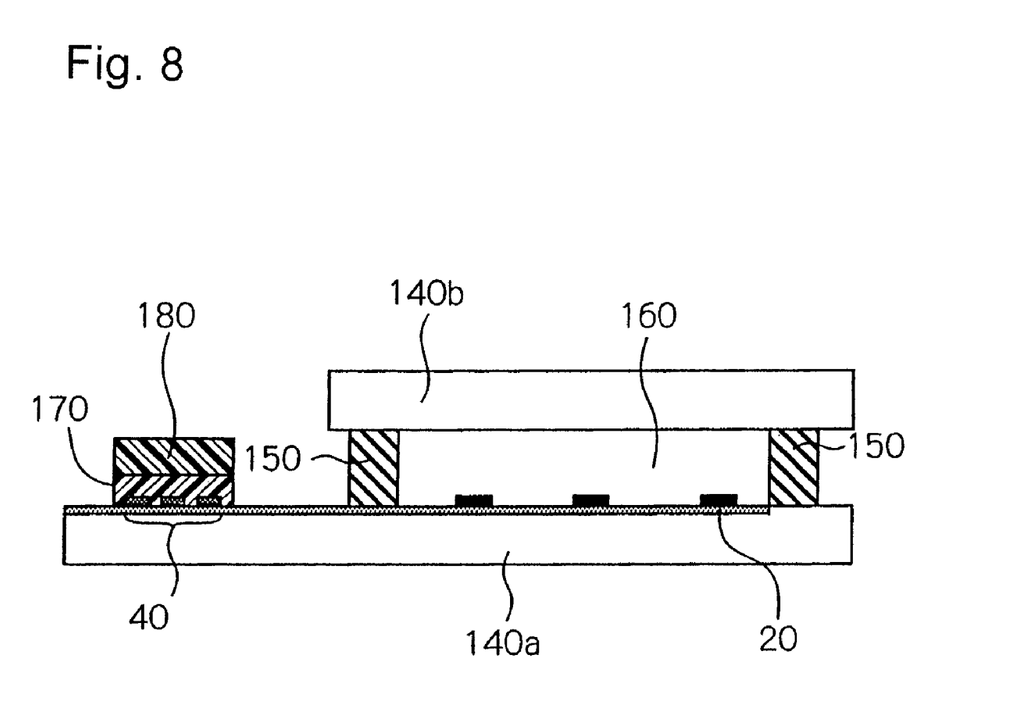

The configuration of an electronic device of the present embodiment will be described. FIG. 8 is a schematic sectional view showing a structure of an electronic device of this embodiment. FIG. 8 shows a case of a liquid crystal display device in which a peripheral drive circuit and a pixel drive circuit are formed with thin film transistors.

Formed on first glass substrate 140a is peripheral drive circuit portion 40 and a pixel drive circuit having thin film transistors 20. Peripheral drive circuit portion 40 includes one or more thin film transistors having a maximum power consumption of 0.01 to 1 mW. Formed over the region of this peripheral drive circuit portion 40 is resin layer 170 consisting of an insulative material. A high thermal conductivity material whose thermal conductivity falls within the range from 0.1 to 4 W/cm·deg is formed over resin layer 170. The layer of this high thermal conductivity material is called high-thermal conductivity layer 180. An example of high-thermal conductivity layer 180 is a metal film. A light-permeable transparent conductive material may also be used as a material for the metal film.

Further second glass substrate 140b is formed opposite the first glass substrate 140a surface on which the pixel drive circuit is formed. First glass substrate 140a and second glass substrate 140b are fixed with liquid crystal seal agent 150. Liquid crystal 160 is sealed inside the space enclosed by first glass substrate 140a, second glass substrate 140b and liquid crystal seal agent 150.

In the electronic device of the present embodiment, resin layer 170 is laminated over peripheral drive circuit portion 40 with many thin film transistors having high power consumption formed thereon, and high-thermal conductivity layer 180 made of metal film etc., is laminated over it. As a specific configuration, acrylic resin having a thickness of some tens of microns is laminated as resin layer 170, and copper foil as a metal film is applied on it. Use of this configuration enables the metal film to radiate heat that arises from self-heating of the thin film transistors of peripheral drive circuit portion 40 and is conveyed through resin layer 170, thus making it possible to suppress temperature rise-of the thin film transistors.

Heretofore, the first to eighth embodiments were described referring to cases where thin film transistors are used as switching elements, but thin film diodes may be used instead.

While preferred embodiments of the present invention have been described using specific terms, such description is for illustrative purposes only, and it is to be understood that changes and variations may be made without departing from the spirit or scope of the following claims.

What is claimed is:

1. An electronic device comprising:
    a first substrate having a thickness of 200 µm or lower with a thin film active element having a maximum power consumption of 0.01 to 1 mW formed thereon;
    a second substrate arranged opposite one surface of the two surfaces of said first substrate, the surface being a side other than a side that formed with said thin film active element; and,
    a high thermal conductivity thin-film portion made up of a thin-film, whose thermal conductivity falls within a range from 0.1 to 4 W/cm·deg and which is arranged in correspondence to a position of said thin film active element and between said first substrate and said second substrate in contact with the substrates.

2. The electronic device according to claim 1, wherein said high thermal conductivity thin-film portion has a portion that is not in contact with said first substrate.

3. The electronic device according to claim 1, wherein said high thermal conductivity thin-film portion is made of metal.

4. The electronic device according to claim 1, wherein said high thermal conductivity thin-film portion includes a high thermal conductive filler as insulative material for enhanced thermal conductivity.

5. The electronic device according to claim 1, wherein said thin film active element is a thin film transistor or thin film diode.

6. The electronic device according to claim 1, wherein said second substrate is formed such that the entire substrate is covered with said high thermal conductivity thin-film portion made of metal and the surface thereof in contact with said first substrate is formed with an uneven texture for causing light diffusion.

7. The electronic device according to claim 1, wherein the thickness of said high thermal conductivity thin-film portion falls within the range of 0.1 to 100 µm.

8. The electronic device according to claim 1, wherein the sticking out distance of the area in said second substrate, which is covered with said high thermal conductivity thin-film portion, from the edge of said first substrate, falls within the range from 1 to 5 mm.

9. The electronic device according to claim 1, wherein said first substrate comprises:
    a peripheral drive circuit including the region formed with said thin film active element;
    thin film active elements to switch pixels, arranged matrix-wise; and,
    interconnection for connecting said peripheral drive circuit to said thin film active elements to switch pixels.

10. The electronic device according to claim 9, wherein said second substrate is constructed such that the region corresponding to said thin film active elements to switch pixels and said interconnection has a transmittance of 70% or higher for visible light rays or has a polarization function for the visible light rays.

11. The electronic device according to claim 9, wherein said peripheral drive circuit comprises:
    a high power consumption portion including a thin film active element having a greater maximum power consumption than that of a standard thin film active element having standard maximum power consumption; and
    a low power consumption portion including a thin film active element having smaller maximum power consumption than that of said standard thin film active element, and, said high power consumption portion is arranged on the side closer to the edge of the first substrate than said low power consumption portion.

12. An electronic device comprising:
    an insulative substrate with a thin film active element having a maximum power consumption of 0.01 to 1 mW formed thereon;
    an insulative material covering said thin film active element and laminated on said insulative substrate; and,
    a high thermal conductivity material laminated on said insulative material and whose thermal conductivity falls within a range from 0.1 to 4 W/cm·deg.

13. The electronic device according to claim 12, wherein said insulative material is a resin material, and said high thermal conductivity material is a metal or a transparent conductive material.

* * * * *